US012690263B2

(12) United States Patent
Guo et al.

(10) Patent No.: US 12,690,263 B2
(45) Date of Patent: Jul. 21, 2026

(54) DUAL P-BODY DOSE REVERSE-CONDUCTING (DPD-RC) IGBT STRUCTURE

(71) Applicant: Alpha and Omega Semiconductor International LP, Toronto (CA)

(72) Inventors: Zhibo Guo, San Jose, CA (US); Karthik Padmanabhan, Palo Alto, CA (US); Lingpeng Guan, San Jose, CA (US); Madhur Bobde, Sunnyvale, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 461 days.

(21) Appl. No.: 18/129,576

(22) Filed: Mar. 31, 2023

(65) Prior Publication Data

US 2024/0332287 A1     Oct. 3, 2024

(51) Int. Cl.
| | |
|---|---|
| *H10D 84/60* | (2025.01) |
| *H10D 8/00* | (2025.01) |
| *H10D 12/00* | (2025.01) |
| *H10D 64/00* | (2025.01) |

(52) U.S. Cl.
CPC ........... *H10D 84/617* (2025.01); *H10D 8/422* (2025.01); *H10D 12/441* (2025.01); *H10D 12/481* (2025.01); *H10D 64/112* (2025.01); *H10D 64/117* (2025.01)

(58) Field of Classification Search
None
See application file for complete search history.

(56) References Cited

U.S. PATENT DOCUMENTS

| | | | |
|---|---|---|---|
| 6,025,622 | A | 2/2000 | Nakagawa et al. |
| 8,384,151 | B2 | 2/2013 | Pfirsch |
| 9,391,070 | B2 | 7/2016 | Matsudai et al. |
| 9,711,626 | B2 | 7/2017 | Pfirsch et al. |
| 10,224,401 | B2 | 3/2019 | Mishra et al. |
| 10,756,207 | B2 | 8/2020 | Mishra et al. |
| 11,810,971 | B2 | 11/2023 | Wu et al. |
| 2012/0181575 | A1* | 7/2012 | Pfirsch ................. H10D 30/668 257/E29.197 |
| 2014/0252408 | A1* | 9/2014 | Yamashita ........... H10D 62/393 257/139 |
| 2016/0240641 | A1* | 8/2016 | Okawara .............. H10D 62/133 |
| 2016/0351561 | A1* | 12/2016 | Senoo .................. H10D 62/129 |
| 2016/0351562 | A1* | 12/2016 | Senoo .................. H10D 12/481 |
| 2016/0359027 | A1* | 12/2016 | Soeno .................. H10D 12/481 |
| 2018/0138170 | A1* | 5/2018 | Hosokawa ............. H10D 62/53 |
| 2019/0081162 | A1* | 3/2019 | Gejo .................... H10D 64/513 |

(Continued)

FOREIGN PATENT DOCUMENTS

TW        201709507 A      3/2017

*Primary Examiner* — Bilkis Jahan
(74) *Attorney, Agent, or Firm* — JDI PATENT; Joshua D. Isenberg

(57) ABSTRACT

A reverse conducting IGBT comprising a substrate having a top side and a back side opposite the top side, one or more IGBT top side cells, one or more diode top side cells including, an IGBT back side collector region is formed in the back side of the substrate underneath the one or more IGBT top side cells, and a boundary area formed in the back side of the substrate underneath a portion of the one or more diode top side cells.

15 Claims, 5 Drawing Sheets

(56) References Cited

U.S. PATENT DOCUMENTS

| | | | |
|---|---|---|---|
| 2019/0228973 A1* | 7/2019 | Kimura | H10D 12/481 |
| 2021/0296479 A1 | 9/2021 | Pfirsch et al. | |
| 2022/0037514 A1 | 2/2022 | Harada et al. | |
| 2022/0093585 A1 | 3/2022 | Baburske | |
| 2022/0359494 A1 | 11/2022 | Lin et al. | |
| 2023/0103191 A1 | 3/2023 | Bertuglia et al. | |

* cited by examiner

DUAL P-BODY DOSE REVERSE-CONDUCTING (DPD-RC) IGBT STRUCTURE

FIELD OF THE DISCLOSURE

Aspects of the present disclosure relate to Insulated Gate Bipolar Transistors (IGBTs), specifically aspects of the present disclosure relate to Reverse-Conducting IGBT (RC-IGBT) compositions having reverse conducting regions and IGBT regions.

BACKGROUND OF THE DISCLOSURE

IGBT devices provide many benefits over metal oxide semiconductor field effect transistors (MOSFET)s for example IGBT devices may be designed to have a tolerance for high breakdown voltages (e.g., greater than 600 Volts) and low on-state voltage. These characteristics make IGBT devices well suited for high voltage, high current applications such as vehicle electric motor control, power supply controllers and power conversion.

In IGBT devices in a forward configuration the IGBT creates a gate voltage controlled resistance to current flowing through the device. That is a more positive voltage applied to the collector than the emitter creates a forward biased diode at the junction between a collector region and a substrate region (also referred to herein as the drift region) and a reverse biased diode is created between the body region and the substrate region. A positive voltage greater than the gate threshold voltage applied to the gate causes a conduction channel forming in body region, which is a path for carriers to migrate from a source region to the drift region, allowing current to flow. The low resistance is attributed to the forward biased diode at the collector/drift junction. Fast switching punch through IGBT devices are generally unidirectional, meaning they do not conduct when arranged in the "reverse configuration." That is, when a lower voltage is applied to the collector than the emitter, current flow will be blocked even if a positive voltage greater than the gate threshold voltage is applied to the gate electrode, because the collector/drift junction is reverse biased. To compensate for this unidirectional flow a monolithic freewheeling diode has been incorporated into some IGBT designs to allow for reverse conduction. This monolithic freewheeling diode in an IGBT serves the same purpose as the body diode in an MOSFET. IGBTs that incorporate a monolithic freewheeling diode have received the name reverse conducting IGBTs (RC-IGBTs).

Current RC-IGBT designs suffer from two major drawbacks. First, the freewheeling diode has a high reverse recovery charge (high $Q_{rr}$). This high reverse recovery charge can cause several issues including discharge of built-up charge as additional current through the emitter of the IGBT and gate bounce. Secondly the IGBT of the RC-IGBT has a snapback voltage causing the IGBT to exhibit very high resistance to voltage from the collector to the emitter until the snapback voltage threshold for the IGBT is reached at which point the IGBT turns "on" exhibiting low resistance. The snapback phenomenon can prevent the full turn-on of IGBT, causing large conduction energy loss, which is suboptimal behavior for the IGBT.

It is within this context that aspects of the present disclosure arise.

BRIEF DESCRIPTION OF THE DRAWINGS

The teachings of the present disclosure can be readily understood by considering the following detailed description in conjunction with the accompanying drawings, in which.

DESCRIPTION OF THE SPECIFIC EMBODIMENTS

Figure 1:
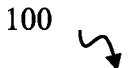
FIG. 1 is a plan view diagram of the back side of an improved RC-IGBT according to an aspect of the present disclosure.
Figure 1:
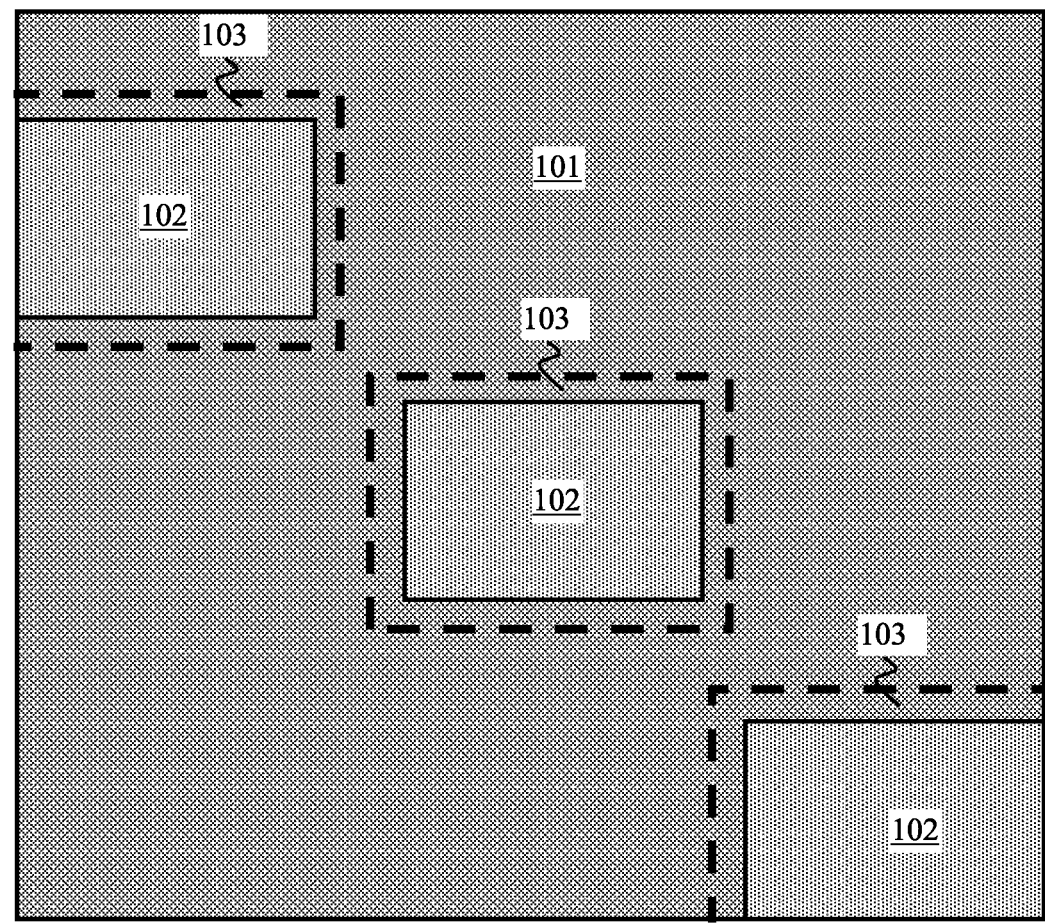

Although the following detailed description contains many specific details for the purposes of illustration, anyone of ordinary skill in the art will appreciate that many variations and alterations to the following details are within the scope of the invention. Accordingly, example embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The disclosure herein refers to a semiconductor material, such as silicon, doped with ions of a first conductivity type or a second conductivity. The ions of the first conductivity type may be opposite ions of a second conductivity type. For example, and without limitation, in some implementations, ions of the first conductivity type may be n-type, which contribute negative charge carriers, e.g., electrons, when doped into silicon. In such implementations, ions of the first conductivity type may include phosphorus, antimony, bismuth, lithium and arsenic. In such implementations, ions of the second conductivity may be p-type, which create holes for charge carriers when doped into silicon and in this way are referred to as being the opposite of n-type. P-type type ions include boron, aluminum, gallium and indium. While the above description referred to n-type as the first conductivity type and p-type as the second conductivity type the disclosure is not so limited, p-type may be the first conductivity type and n-type may be the second conductivity type.

Furthermore, semiconductor materials other than silicon may be used in RC-IGBT devices in accordance with aspects of the present disclosure.

In the following Detailed Description, reference is made to the accompanying drawings, which form a part hereof, and in which is shown by way of illustration specific embodiments in which the invention may be practiced. For convenience, use of + or − after a designation of conductivity or net impurity carrier type (p or n) refers generally to a relative degree of concentration of a designated type of net impurity carriers within a semiconductor material. In general, terms, an n+ material has a higher n type net dopant (e.g., electron) concentration than an n material, and an n material has a higher carrier concentration than an n-material. Similarly, a p+ material has a higher p type net dopant (e.g., hole) concentration than a p material, and a p material has a higher concentration than a p-material. It is noted that what is relevant is the net concentration of the carriers, not necessarily dopant concentration. For example, a material may be heavily doped with n-type dopants but still have a relatively low net carrier concentration if the material is also sufficiently counter-doped with p-type dopants. As used herein, a concentration of dopants less than about $10^{16}/cm^3$ may be regarded as "lightly doped" and a concentration of dopants greater than about $10^{17}/cm^3$ may be regarded as "heavily doped".

In previous implementations of RC-IGBTs the freewheeling diodes integrated into the monolithic substrate with the IGBT were arranged such that the freewheeling diodes areas were interspersed among IGBT areas at regular intervals. In these prior embodiments, each freewheeling diode area directly abuts an IGBT area. Numerous different layouts of freewheeling diode and IGBT have been attempted but they all suffered from issues of high reverse recovery charge and IGBT snap-back, as previously discussed.

A discovery of the problem leading to the present improved RC-IGBT is that the proximity of the freewheeling diode area to the IGBT area is causing the issues found in previous implementations of RC-IGBT. Specifically, the proximity of the IGBT areas to the freewheeling diode areas allows excess holes from the higher dosed IGBT body region to be injected into the freewheeling diode substrate region causing high reverse recovery charge. Additionally, the closeness of the back side diode cathode region to the frontside IGBT area creates a parasitic MOSFET which causes undesirable snapback characteristics in the IGBT.

The improved RC-IGBT resolves the problem found in previous implementations of RC-IGBTs by creating a boundary area between the IGBT area and freewheeling diode area. The boundary area reduces the migration of holes to active diode regions and eliminates the parasitic MOSFET by separating frontside IGBT area and active diode cathode regions.

FIG. 1 is a plan view diagram of the back side of an improved RC-IGBT according to an aspect of the present disclosure. As shown the back side of the RC-IGBT substrate composition 100 includes an IGBT collector region 101 and one or more diode cathode regions 102. As shown, there are three diode cathode regions 102 surrounded by the IGBT collector region 101. The IGBT collector region 101 may encompass a plurality of IGBT structures and the diode cathode regions 102 generally encompass one or more diode structures. The boundary areas 103 are located between the diode cathode regions 102 and IGBT collector regions 101. Boundary areas 103 may surround each of the diode cathode regions 102 and separate the diode cathode regions 102 from the IGBT collector region 101. The boundary areas may be contiguous with the IGBT collector region. For example, and without limitation, two or more diode cathode regions may be separated by two or more corresponding boundary areas and a portion of the IGBT back side collector region. The boundary regions 103 may have the same back side structures as the IGBT collector region 101, and have the same front side structures as the diode cathode regions 102. The boundary regions 103 may reduce hole injection from the IGBT body region and reduce the parasitic MOSFET effect for the IGBT.

Figure 2:
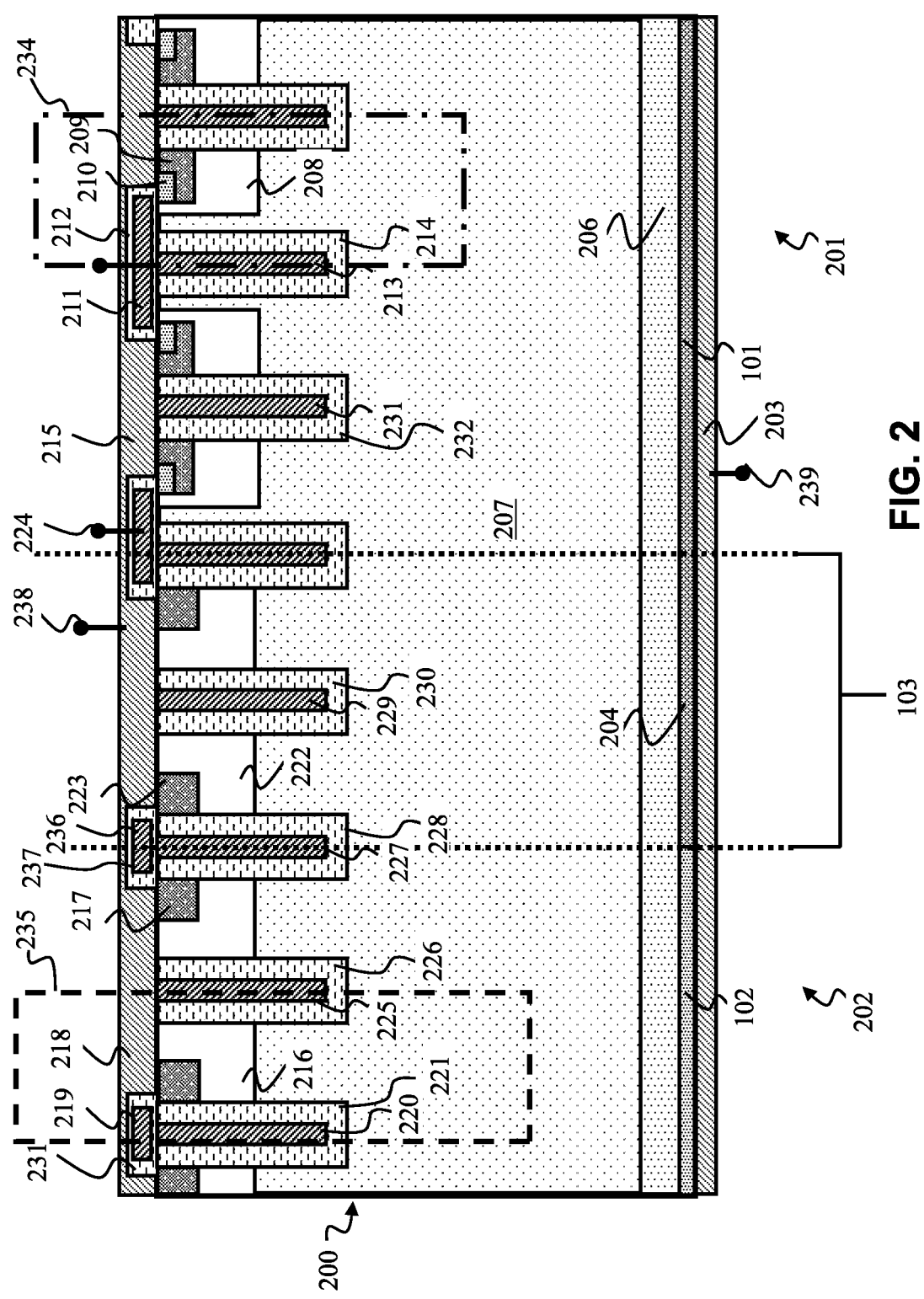
FIG. 2 is a cross sectional view diagram of an improved RC-IGBT having planar gates and charge balancing electrodes according to an aspect of the present disclosure.

FIG. 2 is a cross sectional view diagram of an improved RC-IGBT having planar gates and charge balancing electrodes according to an aspect of the present disclosure. As shown the improved RC-IGBT device includes an IGBT area 201, a freewheeling diode area 202 and a boundary area 103.

The IGBT area 201 may include one or more IGBT top side cells 234. That is, the IGBT area 201 includes the IGBT collector region 101, an (optional) buffer region 206, a substrate region 207 (also referred to as drift region), an IGBT body region 208, an IGBT emitter contact region 209, an IGBT source region 210, an IGBT planar gate electrode 211, a gate charge balancing electrode 213 and a contact charge balancing electrode 231. The substrate region 207 is lightly doped with ions of the first conductivity type, e.g., in a concentration range from 1e13 $cm^{-3}$ to 1e15 $cm^{-3}$. The gate charge balancing insulation layer 214 is created on surfaces of a gate charge balancing trench formed in the substrate composition 200. The gate charge balancing trench may be formed by any suitable trench etching method for example and without limitation masking and reactive ion etching. The gate charge balancing insulation layer may be for example and without limitation a layer of silicon dioxide grown on the inner surface of the trench and may be formed by thermal oxidation or chemical deposition. The gate charge balancing electrode 213 is formed over the gate charge balancing insulation layer 214 and may be composed of a conductive material such as a metal or poly crystalline silicon. The gate charge balancing electrode 213 may be formed by any suitable deposition method for example and without limitation physical or chemical vapor deposition.

The contact charge balancing electrode 231 is formed in a contact charge balancing trench formed in the substrate composition 200. The contact charge balancing trench may be formed by any suitable trench etching method for example and without limitation masking and reactive ion etching. A contact charge balancing insulation layer 232 is formed on the inner surface of the contact charge balancing trench. The contact charge balancing insulation 232 layer may be for example and without limitation a layer of silicon dioxide grown on the inner surface of the trench and may be formed by for example and without limitation by masking and thermal oxidation or chemical deposition. The contact charge balancing electrode 231 is formed over the contact charge balancing insulation layer 232 and may be composed of a conductive material such as a metal of poly crystalline silicon. The gate charge balancing electrode 231 may be formed by any suitable deposition method for example and without limitation physical or chemical vapor deposition. The gate charge balancing electrode 213 and contact charge balancing electrode 231 may be formed contemporaneously. In the implementation shown the one or more IGBT top side cells may include an IGBT body region 208, IGBT emitter contact region 209, IGBT source region 210, IGBT planar gate electrode 211, gate charge balancing electrode 213, IGBT gate charge balancing insulation layer 214, contact charge balancing electrode 231 and contact charge balancing insulation layer 232.

An IGBT body region 208 is located in the substrate 207 and on the top surface of the substrate composition 200. The IGBT body region 208 may be doped with ions of the second conductivity type. The IGBT body region 208 may be formed in the substrate 207 by any suitable doping method for example and without limitation masking and ion implantation. The IGBT body region 208 may have a doping concentration of for example and without limitation between $1e^{13}$ and $1e^{14}$ cm$^{-2}$ and may have an energy of implantation of 50-200 keV.

An emitter contact region 209 may be formed in an upper portion of the body region 208. The emitter contact region 209 may be heavily doped with ions of the second conductivity type. The emitter contact region may be formed by any suitable method, for example and without limitation, masking and ion implantation. The emitter contact region 209 may be doped by implantation to a dose between about 5e12 and about 5e15 cm$^{-2}$ at an energy of implantation between about 20 and about 350 keV. In some alternative implementations the emitter contact region may be omitted. The emitter contact region 209 may reduce latch up during operation of the IGBT. The presence of the heavily doped emitter contact region in the IGBT body region makes the presently disclosed devices Dual P-body Dose Reverse Conducting Insulated Gate Bipolar Transistor type devices (DPD-RC-IGBT).

A source region 210 may be formed in the emitter contact region 209 or alternatively in the IGBT body region 208. The source region 210 may be heavily doped with ions of the first conductivity type and formed by any suitable implantation method for example and without limitation, masking and ion implantation. The doping concentration of the source region may be a dose between about 1e14 and about 5e15 cm$^{-2}$ at an implantation energy between about 30 and about 150 keV. The source region may be next to the emitter contact region or formed inside the emitter contact region at an edge near the gate.

An IGBT gate may be formed on the surface of the substrate composition 200 over the gate charge balancing trench. An IGBT gate insulation layer 212 may first be formed on the surface of the substrate composition 200. The IGBT gate insulation layer may be made from any suitable insulating material for example and without limitation silicon dioxide and may be formed by any suitable method for example and without limitation masking and thermal oxidation. An IGBT gate electrode 211 may be formed on top of the gate insulation layer 212 and may be composed of a conductive material such as a metal or polycrystalline silicon. The IGBT gate electrode 211 may be formed by any suitable deposition method for example and without limitation, chemical vapor deposition, or physical vapor deposition. An additional layer of IGBT gate insulation 212 may be formed around and on top of the IGBT gate electrode 212 isolating the IGBT gate electrode from the emitter metal layer 215.

An IGBT back side collector region 101 may be located on the back side of the substrate composition 200. The IGBT back side collector region 101 may be formed in the substrate region 207 or in the buffer region 206. The IGBT back side collector region 101 may be heavily doped with ions of the second conductivity type. For example, and without limitation, the IGBT back side collector region 101 may be doped at a dose of between about $5e^{12}$ and about $5e^{15}$ cm$^{-2}$ and may be implanted on the back side of the substrate composition with an energy of implantation of between about 15 and about 100 keV. The back side collector region 101 extends in the back side of the substrate composition from the IGBT area 201 through the boundary area 103 ending at a Diode area 202.

The diode area 202 includes one or more diode cells 235. That is, the diode area includes an anode region 216, an (optional) anode contact region 217, a substrate region 207, an (optional) buffer region 206, and a cathode region 102. The diode area may optionally be a charge balanced diode area which, as shown includes a diode charge balancing electrode 220, in a trench in the substrate composition 200 and insulated from the substrate by a charge balancing electrode insulation layer 221 as well as a surface balancing electrode 219 insulated from the metal layer with a surface balancing electrode insulation layer 231. The charge balanced diode area may also optionally include a diode contact region charge balancing electrode 225 in a trench in the substrate composition and insulated from the substrate by a contact region charge balancing electrode insulation layer 226. The contact region charge balancing electrode 225 may be conductively coupled to the top metal layer 218 in the diode area 202. In the implementation shown, a diode top side cell 235 may include the anode region 216, anode contact region 217, diode charge balancing electrode 220, charge balancing electrode insulation layer 221, a surface balancing electrode 219, surface balancing electrode insulation layer 231, contact region charge balancing electrode 225, and contact region charge balancing electrode insulation layer 226. Trenches in the substrate composition may be formed by any suitable trench forming method for example and without limitation masking and reactive ion etching. The insulation layers may be any suitable insulating material for example and without limitation, silicon dioxide and may deposited or grown on the surface of the substrate or in the trenches by any suitable method for example and without limitation masking and thermal oxidation or chemical deposition. Electrodes may be made from any suitable conductive material for example and without limitation polycrystalline silicon and may be deposited on a surface of the insulation by any suitable deposition method for example and without limitation masking and chemical deposition.

The anode region 216 may be formed in a top layer of the substrate region 207. The anode region 216 may be implanted with ions of the second conductivity type. For example and without limitation, the anode region may be doped with suitable ions at a dose between $1e^{13}$ and $1e^{14}$ cm$^{-2}$ at an energy of implantation of between 50 and 200 keV. The anode region may be formed by any suitable doping method for example and without limitation, masking and ion implantation. An anode contact region 217 may optionally be formed in an upper portion of the anode region 216. The anode contact region may be heavily doped with ions of the second conductivity type. By way of example and without limitation, the anode contact region may be implanted to a dose between $5e^{12}$ and $5e^{15}$ cm$^{-2}$ at an energy of implantation of between 20-350 keV.

In conjunction with the boundary region 103, an aspect of the present disclosure that may result in further improvement of diode reverse recovery charge is for the diode anode region (also referred to as the diode body region) to have a lower dopant concentration compared to the IGBT body region 208. This can be implemented by masking and selective-area implantation. The lower body dose in the anode region 216 than in the IGBT body region 208 and adding the boundary region 103 ensure low reverse recovery charge (Qrr) of the diode in an RC-IGBT.

An optional buffer region 206 may be formed in the substrate region 207. The buffer region 206 may be more heavily doped with ions of the first conductivity type than the substrate region. The buffer region may be present in punch-through IGBT implementations and absent in non-punch-through IGBT devices. The (optional) buffer region 206 formed in a lower portion of the substrate region 207 and extends from the IGBT area 201, through the boundary area 103 and the diode area 202. The (optional) buffer region 206 may be doped into the back side of the substrate composition via ion implantation at a dose of, for example and without limitation, between about $2e^{12}$ and about $2e^{13}$ $cm^{-2}$ at an energy of implantation between about 150 and about 600 keV. Alternatively, the (optional) buffer region may be grown on the back side of the substrate composition with for example and without limitation chemical deposition. The grown buffer region may for example and without limitation be 2-15 µm in depth and have a resistivity of 0.1 to 2 Ohm-cm.

As can be seen from the combination of FIG. 1 and FIG. 2 the substrate composition may include one or more diode areas 202. Diode areas 202 may be spread out evenly over the back side of the substrate composition in two dimensions. Additionally in some implementations the diode areas may include two or more diode cells located next to each other. The ratio of the overall size of diode areas 202 to IGBT areas 203 may be chosen based on the application for the RC-IGBT device. For example, and without limitation, devices that require a lower forward voltage drop (VF) of the diode may have a ratio of the overall size of the diode areas to IGBT areas that favors diode areas as compared to other applications with for example 20% of the substrate composition being diode area. Whereas for example and without limitation, in low $Q_{rr}$ applications such as motor drive applications the ratio of the overall size of the diode area to IGBT area may favor IGBT areas as compared to other applications with for example 5% of the substrate composition being diode area.

A back side cathode region 102 may be located on the back side of the substrate composition 200. The back side cathode region 102 may be formed in either the substrate region 207 or the (optional) buffer region 206. The back side cathode region 102 may be implanted with ions of the first conductivity type in the back side of the substrate composition 200 with for example and without limitation, a dose of between $1e^{14}$ and $5e^{15}$ $cm^{-2}$ and an energy of implantation of between 30 and 150 keV. The back side cathode region 102 runs through the extent of the diode region 202 substrate composition 200 ending at the boundary region 103.

The boundary area 103 isolates or partially isolates the diode area from the IGBT area reducing the migration of charged carriers from the IGBT area to the diode area also increasing the distance between the active area of the back side collector region and the active area of the front side IGBT region. The boundary area 103 includes one or more diode top side cells and a boundary back side region 204 heavily doped with ions of the second conductivity type. The boundary back side region may be a portion of the back side collector region 101 that extends into the boundary region 103, underneath one or more diode top side cells. In this implementation the regions in the boundary area include boundary area diode anode regions 222, boundary area diode anode contact regions 223, boundary area diode charge balancing electrodes 227, boundary area diode charge balancing electrode insulation layer 228, boundary area surface balancing electrodes 236, boundary area surface balancing electrode insulation layer 237, boundary area contact region charge balancing electrodes 229, and boundary area contact region charge balancing electrode insulation layer 230. The boundary area 103 with top side diode cells and a doped back side region facilitates ease of construction as new diode area and IGBT area masks do not need to be developed to create the boundary area. In production of the back side in the boundary region the back side collector mask may simply be offset from the IGBT region so that it overlaps portions of the top side diode cells. Aspects of the present disclosure are not so limited for example and without limitation the boundary area may have substrate region at the top side of the substrate composition between the diode area and IGBT area with no diode top side cells in the boundary region. Additionally, in alternative implementations there may be no back side doped region on the back side of the substrate composition between the diode area and IGBT area, leaving substrate at the back side of the substrate composition in the boundary area.

Figure 5:
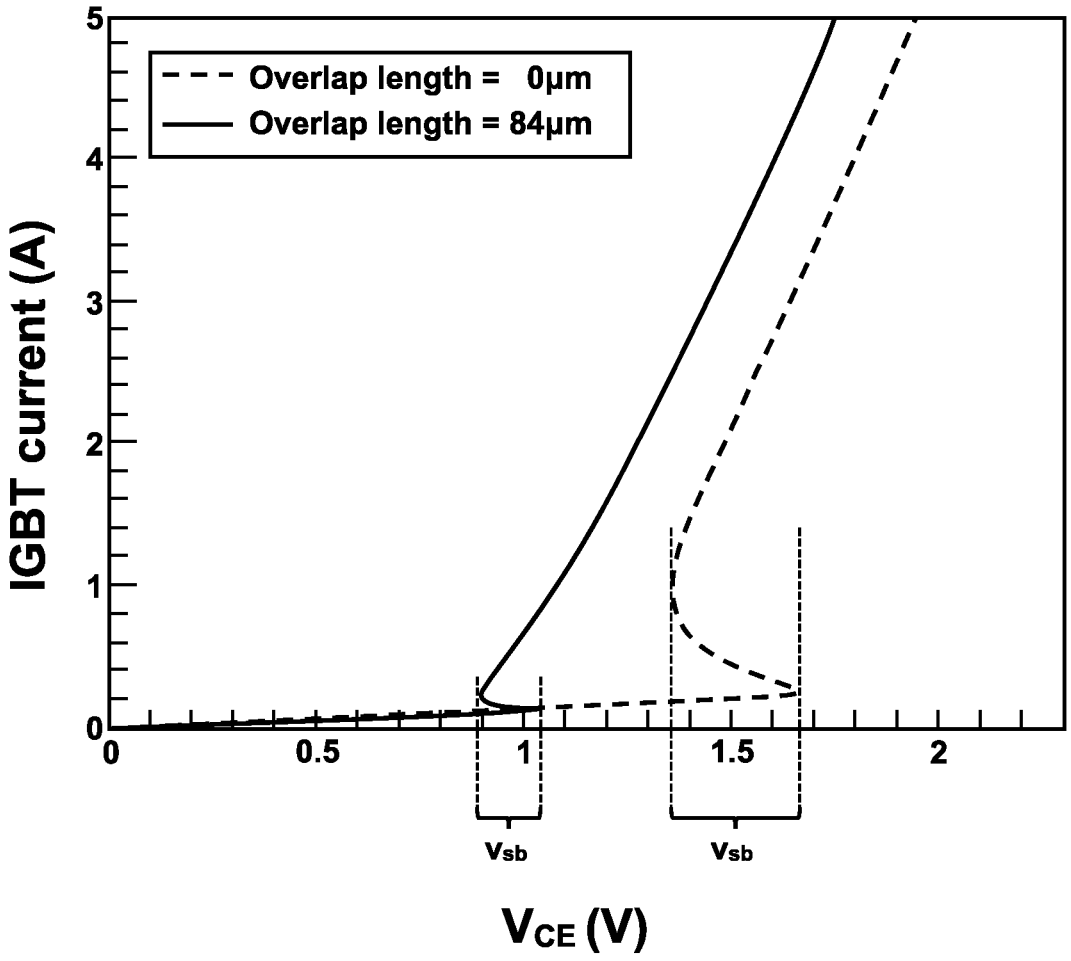
FIG. 5 is a graph illustrating reduction of snapback voltage in an improved RC-IGBT according to an aspect of the present disclosure.

Increasing the size of the boundary area 103 generally improves the characteristics of an RC-IGBT according to aspects of the present disclosure. This may be seen graphically in the simulations depicted in FIG. 5. The graph depicted shows IGBT current versus collector-emitter voltage $V_{CE}$ for two different devices. A first curve 501 is for a conventional RC-IGBT device where there is no overlap between the back side collector region and top side diode structure region. A second curve 502 is for a RC-IGBT device according to aspects of the present disclosure where there is an 84 micron overlap between the back side collector region and top side diode structure region, i.e., the back side boundary region is 84 microns wide in this example. The snapback voltage $V_{sb}$ is significantly reduced in the second curve 502 relative to the first curve 501. Thus, it may be seen that the size of the boundary region affects the snapback voltage and the reverse recovery charge for an RC-IGBT device according to aspects of the present disclosure with a larger boundary region generally reducing both snapback voltage and reverse recovery charge.

Referring again to FIG. 2, a top side metal layer (or emitter metal) 215 may be disposed on the top surface of the substrate composition 200 and may conductively couple the emitter contact regions 209 of the IGBT with the diode anode region 216 and (optionally) the diode anode contact region 217 over the inactive diode cells in the boundary area. In the implementation shown the top side metal 215 is also connected to the IGBT contact charge balancing electrode 231 and a diode contact region charge balancing electrode 225. The top side metal layer may be connected to an emitter terminal 238 for the RC-IGBT device. Similarly, the IGBT gate electrodes 211 may all be connected to a gate terminal 224 for the RC-IGBT device. A back side metal layer (or collector metal) 203 may be disposed on the back side of the substrate composition. The back side metal layer 203 may connect the IGBT collector region 101 and the diode cathode region 102 over the collector region 204 in the boundary area 103. The back side metal layer may be connected to a collector terminal 239. The top side metal layer and back side metal layer may be deposited by any suitable metallic deposition method and any suitable material for example and without limitation, copper, aluminum, silver, gold, nickel, tungsten, or any alloy thereof.

Figure 3:
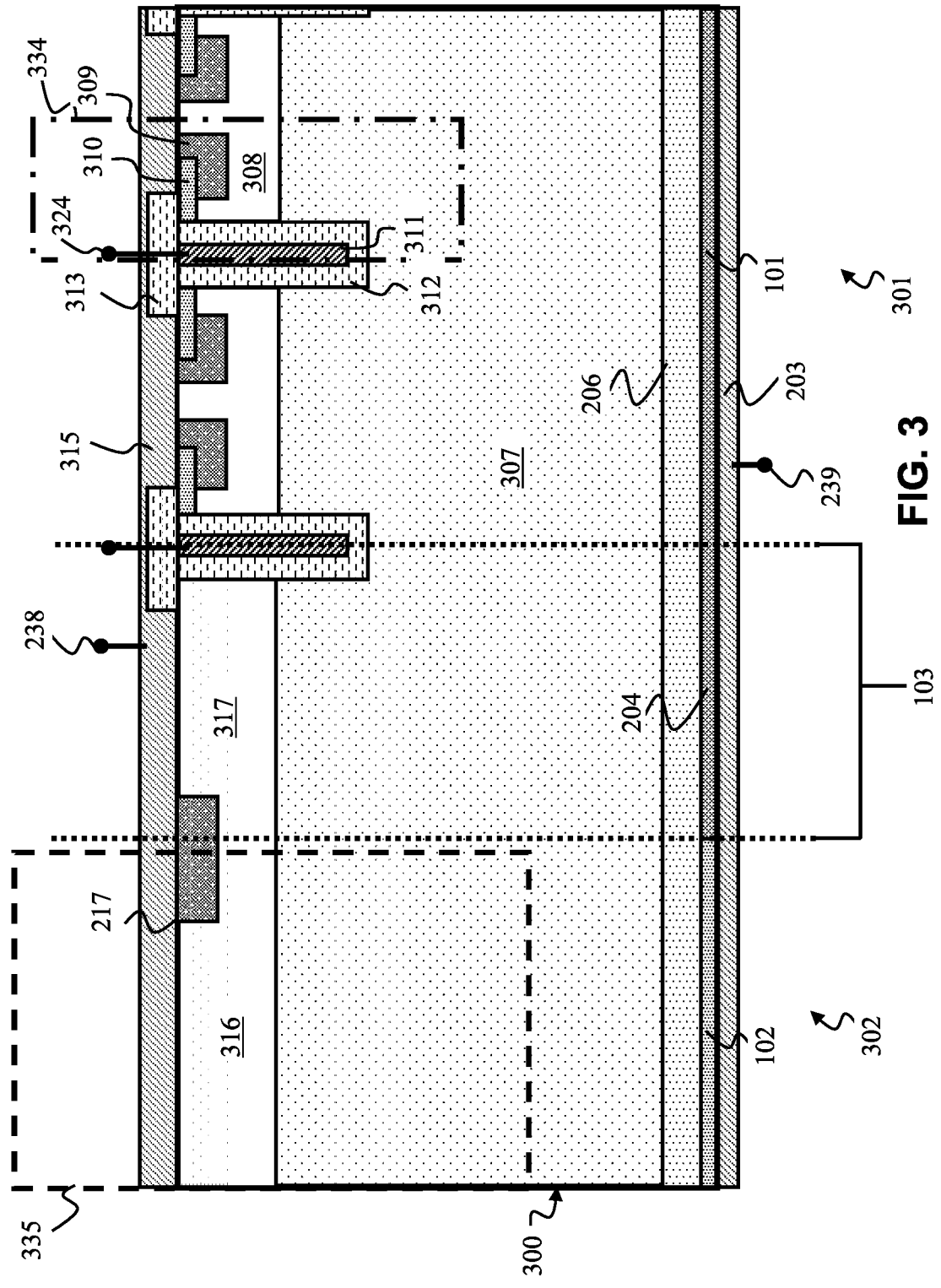
FIG. 3 is a cross sectional view diagram of an improved RC-IGBT having trench gates according to an aspect of the present disclosure.

While FIG. 2 shows a cross section of a planar gate with charge balance electrodes RC-IGBT device in detail, aspects of the present disclosure are not so limited. As shown, FIG. 3 is a cross sectional view diagram of an improved RC-IGBT having trench gates according to an aspect of the present disclosure. In this implementation the IGBT area 301 includes one or more top side IGBT cells 334. The one or more top side IGBT cells include an IGBT body region 308, IGBT emitter contact region 309, Source region 310, and IGBT trench gate electrode 311. The trench gate electrode 311 may be located in a trench formed in the substrate composition 300. The IGBT trench gate electrode 311 may be insulated from the substrate composition by an IGBT trench gate insulation layer 312. The IGBT trench gate electrode 311 may be made from a conductive material such as a metal or polycrystalline silicon and the IGBT trench gate insulation layer 312 may be made from an insulating material such as silicon dioxide. A top side insulating layer 313 made of an insulating material, for example and without limitation silicon dioxide, may be deposited on the surface of the substrate composition 300 and may insulate the trench gate electrode from the top side metal 315.

The IGBT body region 308 may be formed in a portion of the substrate 307 and be doped with ions of the second conductivity type. As in the previously discussed implementation the IGBT substrate region 307 is lightly doped with ions of the first conductivity type. The IGBT body region 308 may be formed by implantation of suitable ions into the substrate region 307 at, for example and without limitation, a dose of between $5e^{12}$ and $5e^{13}$ cm$^{-2}$ at an energy of implantation of between 100 and 900 keV. An IGBT emitter contact region 309 may be located in an upper portion of the IGBT body region 308. The IGBT emitter contact region 309 may be heavily doped with ions of the second conductivity type, for example and without limitation the IGBT emitter contact region may implanted at a dose of between $5e^{12}$ and $5e^{15}$ cm$^{-2}$ at an energy of implantation of between 20 and 350 KeV. An IGBT source region 310 may be located next to the emitter contact region 309 and heavily doped with ions of the first conductivity type. The IGBT source region 310 may be implanted into the IGBT body region 308 to, for example and without limitation a dose of between $1e^{14}$ and $5e^{15}$ at an energy of implantation of between 30 and 150 KeV.

The diode area 302 in trench gate IGBT implementations is simplified compared to the planar gate, charged balance IGBT implementation. The one or more top side diode cells 335 in the diode region 302 include a diode anode region 316. The diode anode region 316 may be formed in an upper portion of the substrate 307 and doped with ions of the second conductivity type. The diode anode region 316 may be implanted with ions to a dose of for example and without limitation between $2e^{12}$ and $2e^{13}$ cm$^{-2}$ at an energy of implantation of between 50 and 350 keV.

The boundary area 103 may also be simplified by including one or more diode top side cells. The boundary area diode anode region 317 may be formed in an upper portion of the substrate 307 and doped with ions of the second conductivity type. The boundary area diode anode region 317 may be implanted with ions to a dose of, e.g., between $2e^{12}$ and $2e^{13}$ cm$^{-2}$ at an implantation energy of between 50 and 350 keV. The boundary back side region 204 is heavily doped with ions of the second conductivity type and runs underneath the diode anode cells 317 created in the boundary area. The function of boundary area 103 in FIG. 3 is the same as that of boundary area 103 in FIG. 2. The diode anode region 316 and/or boundary area diode anode region 317 may include an anode contact region 217, which may be formed in an upper region thereof and configured in a manner similar to that described above. The anode contact region 217 may be heavily doped with ions of the second conductivity type. By way of example and without limitation, the anode contact region may be implanted to a dose between $5e^{12}$ and $5e^{15}$ cm$^{-2}$ at an implantation energy between about 20 keV and about 350 keV.

Figure 4:
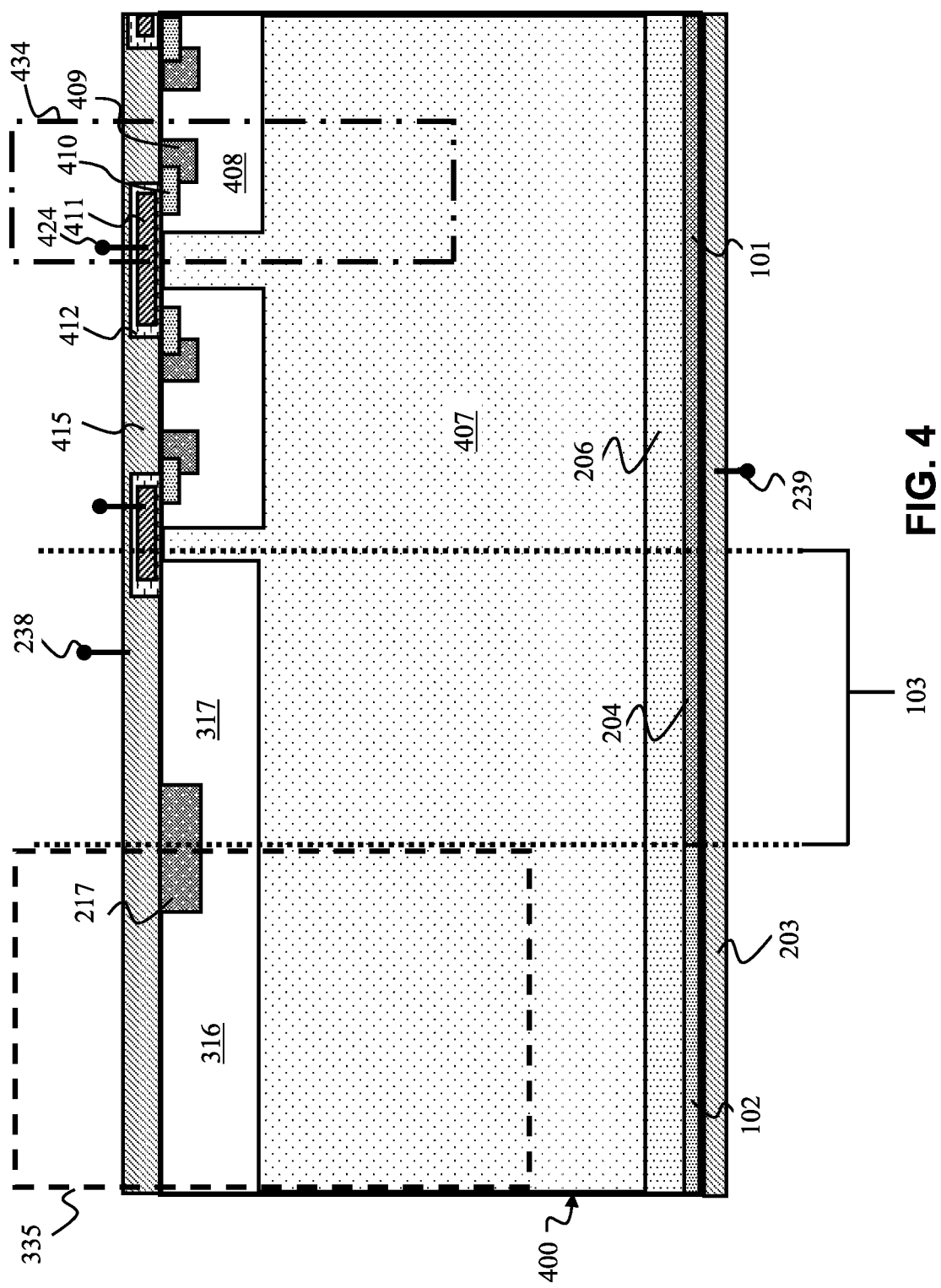
FIG. 4 is a cross sectional view diagram of an improved RC-IGBT having planar gates according to an aspect of the present disclosure.

FIG. 4 is a cross sectional view diagram of an improved RC-IGBT having planar gates according to an aspect of the present disclosure. The planar gate RC-IGBT includes one or more IGBT cells 434 having a planar gate. The one or more IGBT cells 434 include an IGBT body region 408, an IGBT emitter contact region 409, an IGBT source region 410, and an IGBT planar gate electrode 411.

The IGBT planar electrode 411 may be insulated from the substrate composition 400 by a planar electrode insulation layer 412, which may be made of an oxide, such as silicon dioxide. The IGBT planar gate insulation layer 412 may be initially formed on the top side of the substrate composition. The IGBT planar electrode 411 may be disposed on top of the initial planar electrode insulation layer. The IGBT planar gate insulation layer 412 may then be completed around the IGBT planar electrode 411 encapsulating the electrode. The IGBT planar gate insulation layer 412 may be made from an insulating material for example and without limitation silicon dioxide. The IGBT planar electrode may be any suitable conductive material for example and without limitation polycrystalline silicon. The IGBT planar gate insulation layer 412 and IGBT planar gate electrode 411 may both be formed by any suitable method for example and without limitation, masking, etching, thermal growth and Chemical vapor deposition vapor deposition. The IGBT planar gate electrodes may be connected to a gate terminal 424 of the RC-IGBT device.

The IGBT body region 408 may be formed in an upper portion of the substrate 407 and doped with ions of the second conductivity type. The IGBT body region may be implanted by any suitable ion implantation method and may be doped to a dose of, e.g., between $1e^{13}$ and $1e^{14}$ cm$^{-2}$ at an energy of implantation of between 50 and 200 keV. An IGBT emitter contact region 409 may be formed in an upper portion of the IGBT body region 408. The IGBT emitter contact region 409 may be heavily doped with ions of the second conductivity type and may for example and without limitation have a dose of between $5e^{12}$ and $5e^{15}$ cm$^{-2}$ implanted at an energy between 20 and 350 keV. The IGBT emitter contact region 409 may be made by any suitable masking and ion implantation method. The IGBT emitter contact region 409 may act to prevent IGBT latch up. An IGBT source region 410 may be disposed in the IGBT body region next to the IGBT emitter contact region. The IGBT source region 410 may be heavily doped with ions of the first conductivity type and may be located partially underneath the planar gate when the planar gate is formed. The IGBT source region may be created by any suitable masking and ion implantation method and may be doped to a dose of, e.g., between $1e^{14}$ and $5e^{15}$ cm$^{-2}$ at an energy of implantation of between 30 and 150 keV.

The top side diode cell 335 of the planar gate RC-IGBT may be similar to the top side diode cell seen in FIG. 3. The top side metal 415 may connect the top side diode cell 335 to the top side IGBT cell 434 over the boundary area 103. The boundary area 103 of the planar gate RC-IGBT device may be similar to the boundary area of the trench gate RC-IGBT device as shown in FIG. 3. The source region 410 may extend beyond the planar gate edge a little bit, so that the source region 410 touches the top side metal 415 to ensure conduction.

The above disclosure provides an improved RC-IGBT device over the prior RC-IGBT implementation. The improved RC-IGBT resolves the problem found in previous implementations of RC-IGBTs by creating a boundary area between the IGBT area and freewheeling diode area. The boundary area allows reduces the migration of holes to active diode regions and eliminates the parasitic MOSFET by separating active front side IGBT region and active back side diode cathode regions. Additionally the improved RC-IGBT allows for reduced doping concentrations in the diode anode region further reducing diode reverse recovery charge. Thus the disclosed RC-IGBT shows improved freewheeling diode $Q_{rr}$ and IGBT snapback characteristics as compared to previously seen RC-IGBT devices.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A reverse conducting IGBT comprising:

a substrate having a top side and a back side opposite the top side doped with ions of a first conductivity type wherein the first conductivity type is opposite a second conductivity type;

one or more IGBT top side cells including, an IGBT body region formed in the top side of the substrate and doped with ions of the second conductivity type, and an IGBT source region formed in the IGBT body region heavily doped with ions of the first conductivity type;

one or more diode top side cells including, a diode anode region formed in the top side substrate layer doped with ions of the second conductivity type;

an IGBT back side collector region formed in the back side of the substrate underneath the one or more IGBT top side cells and heavily doped with ions of the second conductivity type;

a boundary area formed in the back side of the substrate underneath a portion of the one or more diode top side cells and heavily doped with ions of the second conductivity type, wherein the boundary area is adjacent to or contiguous with the IGBT back side collector region, whereby the boundary area overlaps a portion of the one or more diode top side cells, wherein the size of the boundary area is chosen to significantly reduce the snapback voltage of the IGBT and the reverse recovery charge of the diode due to hole injection from nearby IGBT body diode regions into a diode substrate region.

2. The reverse conducting IGBT of claim 1 further comprising a back side diode cathode region formed in the back side of the substrate underneath a portion of the one or more diode top side cells and heavily doped with ions of the first conductivity type.

3. The reverse conducting IGBT of claim 2 wherein the boundary area separates the back side diode cathode region from the front side IGBT region.

4. The reverse conducting IGBT of claim 2 wherein the back side diode cathode region is surrounded by the IGBT back side collector region and wherein the boundary area is between the back side diode cathode region and the IGBT back side collector region.

5. The reverse conducting IGBT of claim 4 wherein the boundary area surrounds the back side diode cathode region.

6. The reverse conducting IGBT of claim 2 wherein two or more diode cathode regions are separated by two or more corresponding boundary areas and a portion of the IGBT back side collector region.

7. The reverse conducting IGBT of claim 1 wherein a buffer region is formed in the back side of the substrate and heavily doped with ions of the first conductivity type and wherein the IGBT back side collector region and boundary area are formed in the buffer region.

8. The reverse conducting IGBT of claim 1 wherein the one or more IGBT top side cells further include a planar gate electrode over the top surface of the substrate and insulated from the substrate.

9. The reverse conducting IGBT of claim 1 wherein the one or more IGBT top side cells further include a trench gate electrode formed in a trench in the top side of the substrate and insulated from the substrate.

10. The reverse conducting IGBT of claim 1 wherein the one or more IGBT top side cells further include a planar gate electrode over the top surface of the substrate insulated from the substrate and an IGBT charge balancing electrode formed in a trench in the top side of the substrate insulated from the substrate.

11. The reverse conducting IGBT of claim 10 wherein the one or more diode top cells further includes one or more diode charge balancing electrode formed in a trench in the top side of the substrate insulated from the substrate.

12. The reverse conducting IGBT of claim 11 wherein the diode top cells further include one or more diode anode contact regions formed in the diode anode region heavily doped with ions of the second conductivity type.

13. The reverse conducting IGBT of claim 1 wherein the one or more IGBT top side cells further include an IGBT emitter region heavily doped with ions of the second conductivity type and formed next to the IGBT source region.

14. The reverse conducting IGBT of claim 1 wherein the diode anode region has a lower dopant concentration than the IGBT body region.

15. The reverse conducting IGBT of claim 1, wherein the diode anode region has a lower dose of ions of the second conductivity type than the IGBT body region.

* * * * *